United States Patent
Christensen

(10) Patent No.: US 7,072,430 B2
(45) Date of Patent: Jul. 4, 2006

(54) TECHNIQUES TO PROVIDE INCREASED VOLTAGE SWINGS IN OSCILLATORS

(75) Inventor: Kenn Christensen, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/196,684

(22) Filed: Aug. 2, 2005

(65) Prior Publication Data

US 2005/0265229 A1 Dec. 1, 2005

Related U.S. Application Data

(62) Division of application No. 10/643,569, filed on Aug. 18, 2003, now Pat. No. 6,998,927.

(51) Int. Cl.
*H04L 7/00* (2006.01)
*H03B 5/12* (2006.01)

(52) U.S. Cl. .................................. 375/354; 331/117 R

(58) Field of Classification Search ........ 375/354–355; 331/111, 113 R, 117 R, 117 FE, 117 D
See application file for complete search history.

(56) References Cited

U.S. PATENT DOCUMENTS

| | | | |
|---|---|---|---|
| 2,930,002 A | | 3/1960 | Edwards et al. |
| 5,315,622 A | * | 5/1994 | Abbiate et al. ............. 375/354 |
| 6,046,647 A | | 4/2000 | Nelson |
| 6,463,109 B1 | * | 10/2002 | McCormack et al. ....... 375/355 |

OTHER PUBLICATIONS

Purdie, Ian C., "Clapp Oscilliators", located at http://www.electronics-tutorials.com/oscillators/clapp-oscillators.htm, last updated Jun. 7, 2004.

* cited by examiner

*Primary Examiner*—David Mis
(74) *Attorney, Agent, or Firm*—Glen B. Choi

(57) ABSTRACT

Briefly, an oscillator device with impedance elements to prevent premature improper biasing of transistor nodes and to increase the maximum possible peak-to-peak signal swing.

21 Claims, 4 Drawing Sheets

TECHNIQUES TO PROVIDE INCREASED VOLTAGE SWINGS IN OSCILLATORS

CROSS-REFERENCE TO RELATED APPLICATIONS

The present application is a divisional application of and claims the priority date of U.S. patent application Ser. No. 10/643,569 entitled "TECHNIQUES TO PROVIDE INCREASED VOLTAGE SWINGS IN OSCILLATORS," filed Aug. 18, 2003, now U.S. Pat. No. 6,998,927, and assigned to the assignee of the present invention.

FIELD

The subject matter disclosed herein generally relates to techniques to generate a sinusoidal signal.

RELATED ART

Oscillator devices are well known sources of sinusoidal signals. Some sine-wave oscillators use resonant circuits consisting of inductor and capacitor elements. For example, an LC-tank circuit stores energy alternately in the inductor and capacitor to produce a sine wave. The output frequency of the oscillator is primarily the resonant frequency of the tank circuit and can be represented as:

$$f_r = \frac{1}{2\pi\sqrt{LC}}$$

Each resonant circuit does, however, contain some resistance which dissipates power. This power loss causes the amplitude to decrease. Loading the tank causes the same effect as increasing the internal resistance of the tank.

FIG. 1A depicts a prior art oscillator 10. Oscillator 10 may provide a sinusoidal output signal across nodes OUT and OUTN. The peak-to-peak voltage range between the nodes OUT and OUTN of oscillator 10 is limited, in part, to maintain forward voltage biasing of the diode-like base-collector terminals of the transistors A1 and A2. For example, the maximum peak-to-peak voltage range between the nodes OUT and OUTN of oscillator 10 may be approximately 1.4 volts.

FIG. 1B depicts another prior art oscillator 20. Oscillator 20 may provide a sinusoidal output signal across nodes OUT and OUTN. The peak-to-peak voltage range between the nodes OUT and OUTN of oscillator 20 is limited, in part, to maintain forward voltage biasing of the diode-like base-collector terminals of the transistors C1 and C2 and the diode-like base-emitter terminals of the transistors B1 and B2. For example, the peak-to-peak voltage range between the nodes OUT and OUTN of oscillator 20 may be approximately 2.8 volts.

What is needed is a device that provides a sinusoidal signal without the peak-to-peak voltage limitations based on forward biasing diode-like terminals of the transistors utilized in the device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Note that use of the same reference numbers in different figures indicates the same or like elements.

DETAILED DESCRIPTION

Figure 1A:
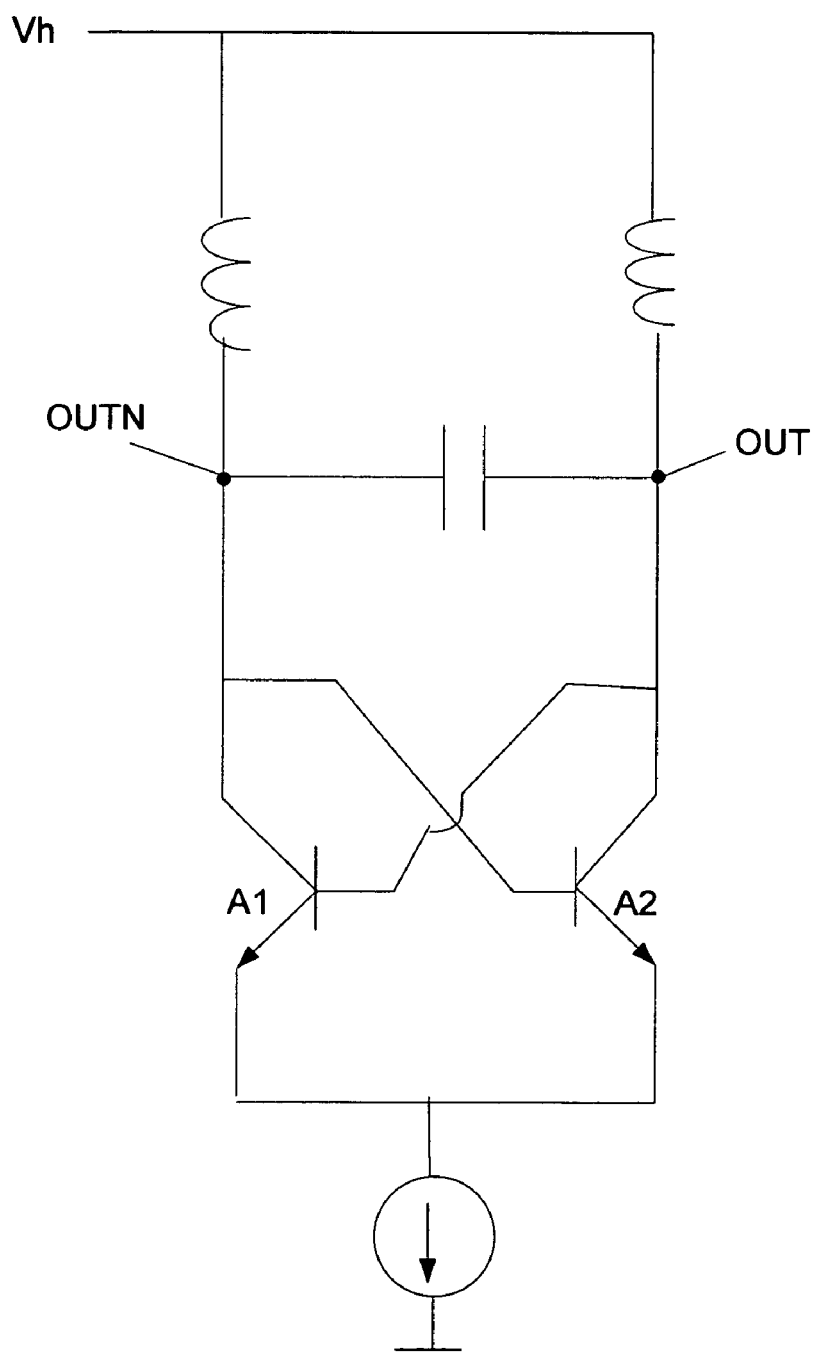
FIGS. 1A and 1B depict prior art oscillators.
Figure 1B:
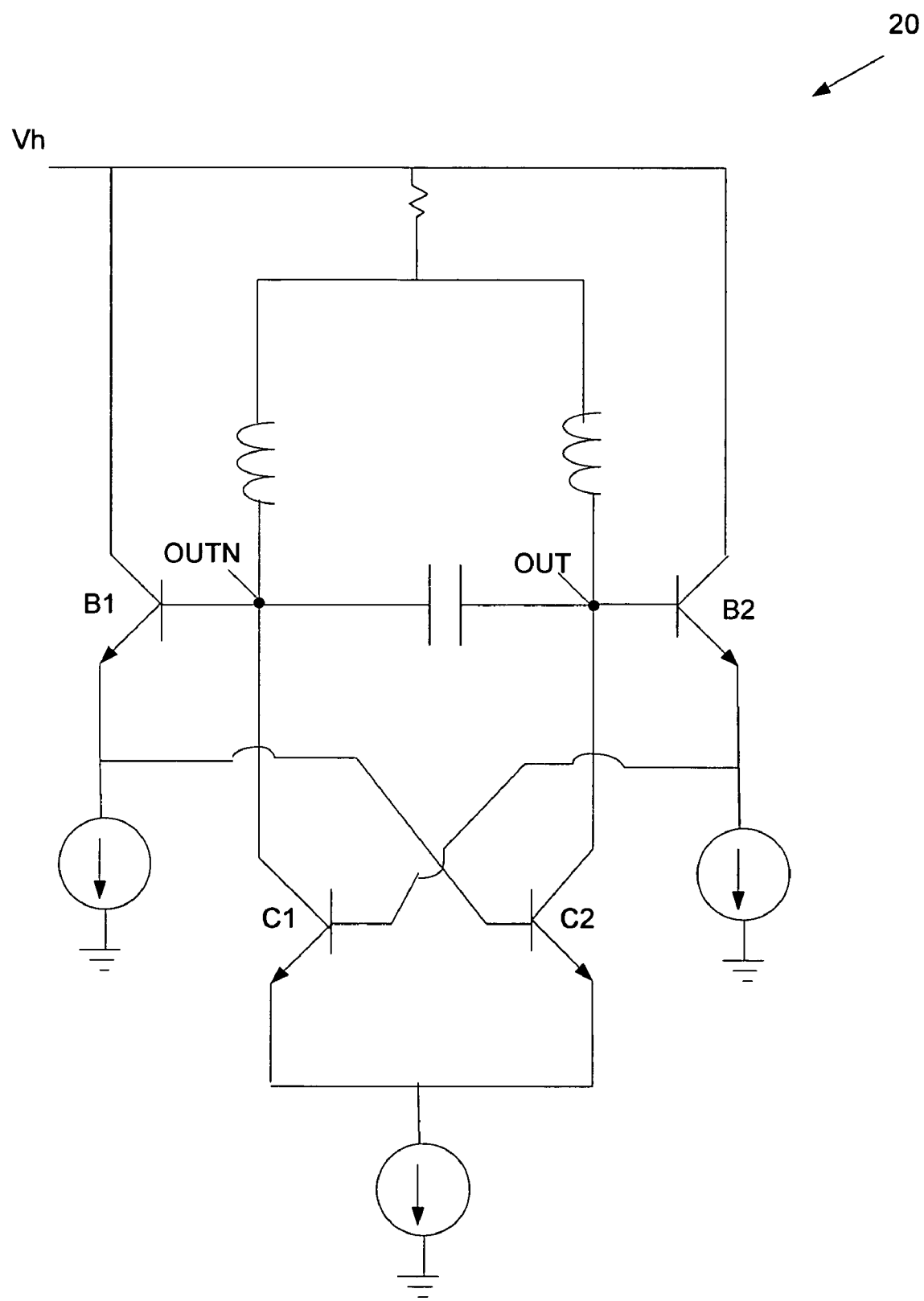
Figure 2:
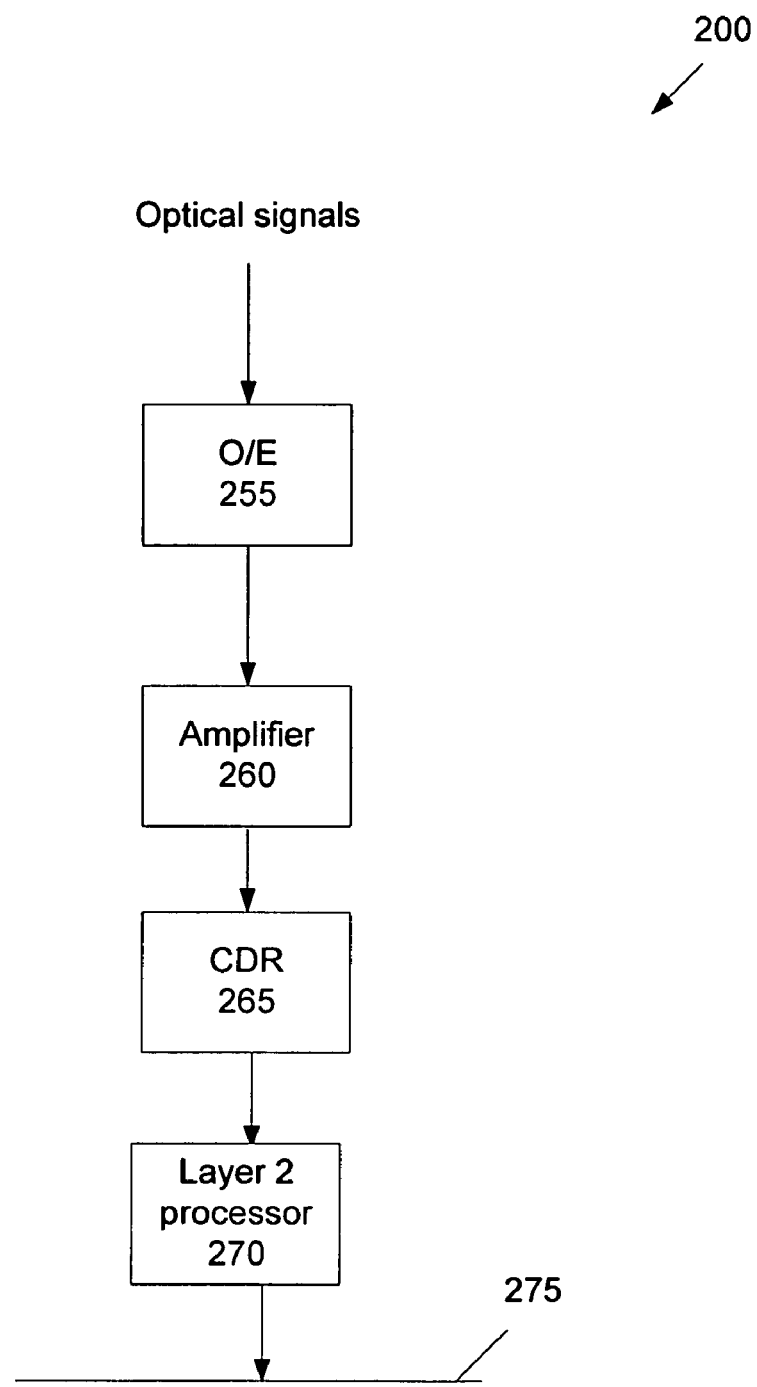
FIG. 2 depicts a system in which some embodiments of the present invention may be used.

FIG. 2 depicts one possible system in which some embodiments of the present invention may be used. Receiver 200 may receive signals encoded in compliance for example with optical transport network (OTN), Synchronous Optical Network (SONET), and/or Synchronous Digital Hierarchy (SDH) standards. Example optical networking standards may be described in ITU-T Recommendation G.709 Interfaces for the optical transport network (OTN) (2001); ANSI T1.105, Synchronous Optical Network (SONET) Basic Description Including Multiplex Structures, Rates, and Formats; Bellcore Generic Requirements, GR-253-CORE, Synchronous Optical Network (SONET) Transport Systems: Common Generic Criteria (A Module of TSGR, FR-440), Issue 1, December 1994; ITU Recommendation G.872, Architecture of Optical Transport Networks, 1999; ITU Recommendation G.825, "Control of Jitter and Wander within Digital Networks Based on SDH" March, 1993; ITU Recommendation G.957, "Optical Interfaces for Equipment and Systems Relating to SDH", July, 1995; ITU Recommendation G.958, Digital Line Systems based on SDH for use on Optical Fiber Cables, November, 1994; and/or ITU-T Recommendation G.707, Network Node Interface for the Synchronous Digital Hierarchy (SDH) (1996).

Referring to FIG. 2, optical-to-electrical converter ("O/E") 255 may convert optical signals received from an optical network from optical format to electrical format. Although reference has been made to optical signals, the receiver 200 may, in addition or alternatively, receive electrical signals from an electrical signal network or wireless or wire-line signals according to any standards. Amplifier 260 may amplify the electrical signals. Clock and data recovery unit ("CDR") 265 may regenerate the electrical signals and corresponding clock and provide the regenerated signals and corresponding clock to layer 2 processor 270. CDR 265 may use some embodiments of the present invention.

On the regenerated signals, layer two processor 270 may perform media access control (MAC) management in compliance for example with Ethernet, described for example in versions of IEEE 802.3; optical transport network (OTN) de-framing and de-wrapping in compliance for example with ITU-T G.709; forward error correction (FEC) processing, in accordance with ITU-T G.975; and/or other layer 2 processing.

Interface 275 may provide intercommunication between layer two processor 270 and other devices such as a memory device (not depicted), packet processor (not depicted), microprocessor (not depicted), and/or a switch fabric (not depicted). Interface 275 may provide intercommunication between layer two processor 270 and other devices using an interface that complies with one or more of the following standards: Ten Gigabit Attachment Unit Interface (XAUI) (described in IEEE 802.3, IEEE 802.3ae, and related standards), Serial Peripheral Interface (SPI), I²C, CAN, universal serial bus (USB), IEEE 1394, Gigabit Media Independent Interface (GMII) (described in IEEE 802.3, IEEE 802.3ae, and related standards), Peripheral Component Interconnect (PCI), Ethernet (described in IEEE 802.3 and related standards), ten bit interface (TBI), and/or a vendor specific multi-source agreement (MSA) protocol.

Figure 3:
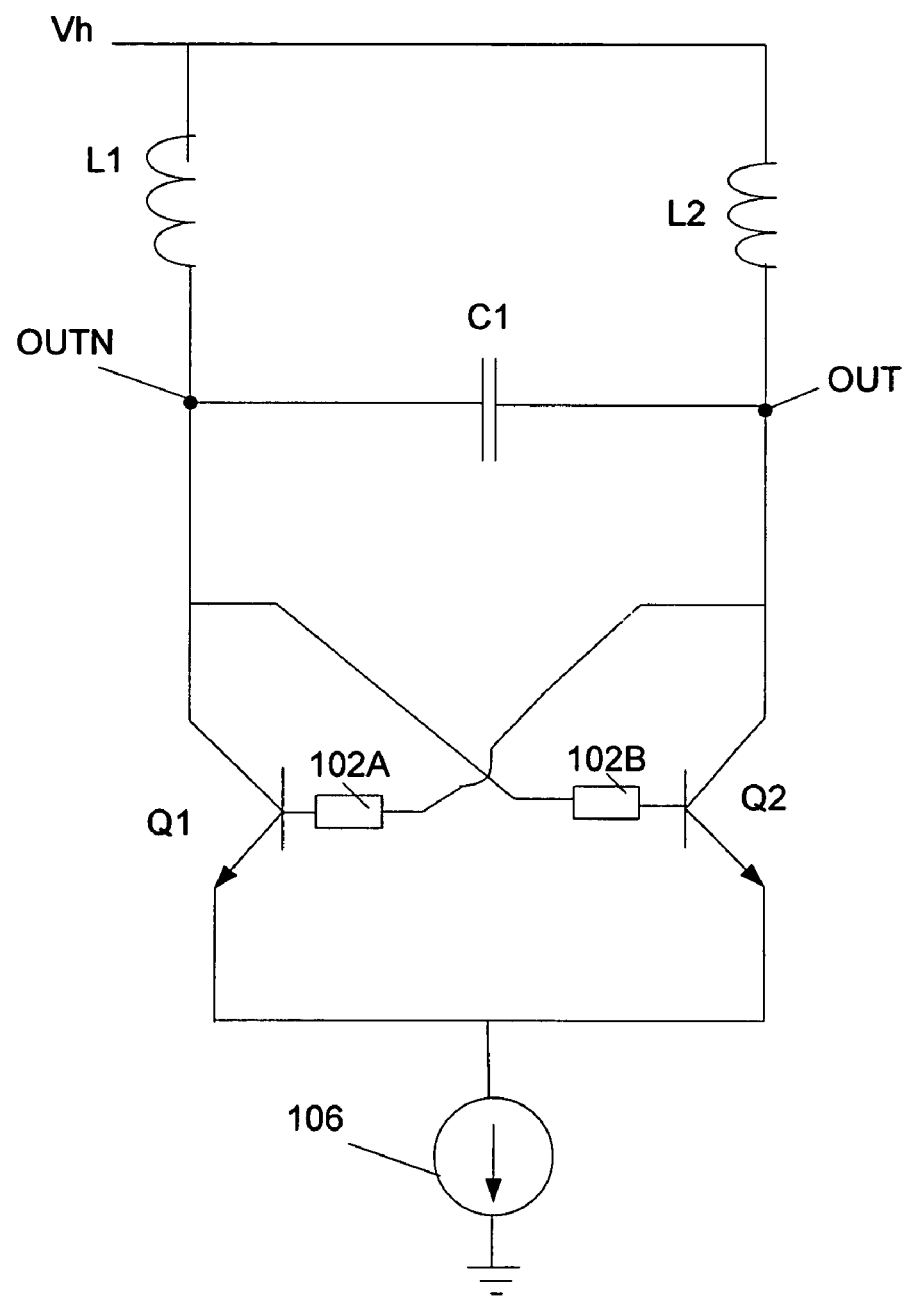
FIG. 3 depicts an oscillator in accordance with an embodiment of the present invention.

FIG. 3 depicts one implementation of an oscillator 100 in accordance with an embodiment of the present invention. Oscillator 100 may provide a sinusoidal signal having a peak-to-peak voltage range that is not limited by the base-collector diodes of utilized transistors. One implementation of oscillator 100 may include transistors Q1 and Q2, capacitive element C1, inductors L1 and L2, impedance elements 102A and 102B, and current source 106. Output terminals OUT and OUTN of oscillator 100 may provide a sinusoidal signal. Of course other implementations may be used.

Transistors Q1 and Q2 may be implemented as bipolar junction transistor (BJT) devices having similar characteristics. Other types of transistors may be used. Inductors L1 and L2 may couple a bias voltage Vh to collector terminals of respective transistors Q1 and Q2. In one implementation, inductors L1 and L2 may have approximately the same inductance values. Emitter terminals of transistors Q1 and Q2 may be coupled to current source 106. Impedance element 102A may couple a base terminal of transistor Q1 to terminal OUT. Impedance element 102B may couple a base terminal of transistor Q2 to terminal OUTN. In one implementation, impedance elements 102A and 102B may have approximately the same impedance values. In one implementation, each of impedance elements 102A and 102B may be implemented as a capacitive element in parallel with a resistive element. Impedance elements 102A and 102B do not load the LC tank, thereby providing an improvement over the well-known Clapp configuration. In the Clapp configuration, a resistive biasing is in parallel with the LC tank, thus adding load to the LC tank. Utilizing high resistance and capacitances in the impedance elements 102A and 102B may increase the range of peak-to-peak voltages that can be provided by nodes OUT and OUTN. Capacitive element C1 may couple node OUTN to node OUT.

The frequency of a sinusoidal signal provided by nodes OUTN and OUT may be defined by:

$$f_r = \frac{1}{2\pi\sqrt{LC}}$$

where L is the impedance of L1 and
C is the capacitance of capacitive element C1.

The impedance elements 102A and 102B may control a peak-to-peak range of sinusoidal voltages provided between nodes OUT and OUTN. When a peak voltage is provided at node OUT, there is a voltage build-up across impedance element 102A prior to settling the base terminal voltage of transistor Q1. The voltage build-up across impedance element 102A extends a voltage peak that can be applied at node OUTN and maintain an operating base terminal voltage of transistor Q1. Settling a bias voltage at the base terminal of transistor Q1 may cause the voltage at node OUTN to go to a peak value, which leads to a voltage build-up across impedance element 102B. A voltage build-up across impedance element 102B extends a voltage peak that can be applied at node OUTN and maintain an operating base terminal voltage of transistor Q2. The impedance elements 102A and 102B thereby provide for an extended peak-to-peak voltage oscillation range at least over those of oscillators 10 and 20.

For example, in one implementation, terminals OUT and OUTN may provide a sinusoidal voltage signal having a peak-to-peak swing of approximately 3.75 volts. In this implementation, impedance elements 102A and 102B each have a resistance component of approximately 10 kiloohms in parallel with a capacitance of 10 nanofarads (nF); the inductance of each of inductors L1 and L2 may be approximately 10 micro Henry (mH); a bias voltage of approximately 3.3 volts; a capacitance of capacitive element C1 may be 1 nanofarads (nF); and the current source 106 may provide a current of 2 milliamperes (mA). Of course, other parameters may be used.

MODIFICATIONS

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A system comprising:
   a signal retimer device to regenerate a first signal based on a clock signal, wherein the signal retimer device comprises a clock generator to provide the clock signal and wherein the clock generator comprises:
   a first transistor device including first, second, and third terminals,
   a second transistor device including first, second, and third terminals,
   a first impedance device to couple the second terminal of the second transistor device to the first terminal of the first transistor device, and
   a second impedance device to couple the second terminal of the first transistor device to the first terminal of the second transistor device, wherein the first impedance device comprises a capacitive element and a resistive element, wherein each of the capacitive element and the resistive element includes first and second terminals, wherein the first terminal of the capacitive element and the first terminal of the resistive element are each coupled to the second terminal of the second transistor device, and wherein the second terminal of the capacitive element and the second terminal of the resistive element are each coupled to the first terminal of the first transistor device, and
   the second impedance device comprises a capacitive element and a resistive element, wherein each of the capacitive element and the resistive element includes first and second terminals, wherein the first terminal of the capacitive element and the first terminal of the resistive element are each coupled to the second terminal of the first transistor device, and wherein the second terminal of the capacitive element and the second terminal of the resistive element are each coupled to the first terminal of the second transistor device;
   a data processor to receive the regenerated first signal; and
   an interface device to exchange signals with the data processor.

2. The system of claim 1, further comprising a XAUI compatible interface to couple the data processor with the interface device.

3. The system of claim 1, wherein the data processor comprises logic to perform media access control in compliance with IEEE 802.3.

4. The system of claim 1, wherein the data processor comprises logic to perform optical transport network deframing in compliance with ITU-T G.709.

5. The system of claim 1, wherein the data processor comprises logic to perform forward error correction processing in compliance with ITU-T G.975.

6. The system of claim 1, further comprising a switch fabric communicatively coupled to the interface device.

7. The system of claim 1, further comprising a packet processor communicatively coupled to the interface device.

8. The system of claim 1, further comprising an optical-to-electrical converter to convert optical signals to electrical format.

9. The system of claim 8, further comprising an amplifier to amplify electrical format signals.

10. The system of claim 1, wherein the first signal is formatted in compliance with Synchronous Optical Network (SONET).

11. The system of claim 1, wherein the first signal is formatted in compliance with Synchronous Digital Hierarchy (SDH).

12. The system of claim 1, wherein the first signal is formatted in compliance with optical transport network (OTN).

13. The system of claim 1, wherein the interface device is compliant at least with Serial Peripheral Interface (SPI).

14. The system of claim 1, wherein the interface device is compliant at least with Ten Gigabit Attachment Unit Interface (XAUI).

15. A system comprising:
   an optical-to-electrical converter to convert optical signals to electrical format and provide a first signal in electrical format;
   a signal retimer device to regenerate the first signal based on a clock signal, wherein the signal retimer device comprises a clock generator to provide the clock signal and wherein the clock generator comprises:
      a first transistor device including first, second, and third terminals,
      a second transistor device including first, second, and third terminals,
      a first impedance device to couple the second terminal of the second transistor device to the first terminal of the first transistor device, and
      a second impedance device to couple the second terminal of the first transistor device to the first terminal of the second transistor device, wherein the first impedance device comprises a capacitive element and a resistive element, wherein each of the capacitive element and the resistive element includes first and second terminals, wherein the first terminal of the capacitive element and the first terminal of the resistive element are each coupled to the second terminal of the second transistor device, and wherein the second terminal of the capacitive element and the second terminal of the resistive element are each coupled to the first terminal of the first transistor device, and the second impedance device comprises a capacitive element and a resistive element, wherein each of the capacitive element and the resistive element includes first and second terminals, wherein the first terminal of the capacitive element and the first terminal of the resistive element are each coupled to the second terminal of the first transistor device, and wherein the second terminal of the capacitive element and the second terminal of the resistive element are each coupled to the first terminal of the second transistor device;

a data processor to receive the regenerated first signal;
   an interface device to exchange signals with the data processor; and
   a switch fabric communicatively coupled to the interface device.

16. The system of claim 15, wherein the data processor comprises logic to perform media access control in compliance with IEEE 802.3.

17. The system of claim 15, wherein the data processor comprises logic to perform optical transport network deframing in compliance with ITU-T G.709.

18. The system of claim 15, wherein the data processor comprises logic to perform forward error correction processing in compliance with ITU-T G.975.

19. The system of claim 15, further comprising a packet processor communicatively coupled to the interface device.

20. The system of claim 15, wherein the interface device is compliant at least with Serial Peripheral Interface (SPI).

21. The system of claim 15, wherein the interface device is compliant at least with Ten Gigabit Attachment Unit Interface (XAUI).

* * * * *